(12) United States Patent
Zednicek et al.

(10) Patent No.: US 9,545,008 B1
(45) Date of Patent: Jan. 10, 2017

(54) SOLID ELECTROLYTIC CAPACITOR FOR EMBEDDING INTO A CIRCUIT BOARD

(71) Applicant: AVX Corporation, Fountain Inn, SC (US)

(72) Inventors: Stanislav Zednicek, Lanskroun (CZ); Jan Petrzilek, Usti nad Orlici (CZ)

(73) Assignee: AVX Corporation, Fountain Inn, SC (US)

( * ) Notice: Subject to any disclaimer, the term of this patent is extended or adjusted under 35 U.S.C. 154(b) by 0 days.

(21) Appl. No.: 15/079,909

(22) Filed: Mar. 24, 2016

(51) Int. Cl.
| | | |
|---|---|---|
| *H05K 1/16* | (2006.01) |
| *H05K 1/18* | (2006.01) |
| *H01G 9/15* | (2006.01) |
| *H01G 9/012* | (2006.01) |

(52) U.S. Cl.
CPC .............. *H05K 1/183* (2013.01); *H01G 9/012* (2013.01); *H01G 9/15* (2013.01); *H05K 2201/10015* (2013.01); *H05K 2201/10651* (2013.01); *H05K 2201/10818* (2013.01)

(58) Field of Classification Search
USPC .................. 174/260; 361/529, 358, 525, 540
See application file for complete search history.

(56) References Cited

U.S. PATENT DOCUMENTS

| | | |
|---|---|---|
| 2,756,485 A | 7/1956 | Abramson et al. |
| 2,936,514 A | 5/1960 | Millard |
| 3,345,545 A | 10/1967 | Bourgault et al. |
| 3,588,628 A | 6/1971 | Beck |
| 3,781,976 A | 1/1974 | Tomiwa |
| 3,789,274 A | 1/1974 | Pfister |
| 3,828,227 A | 8/1974 | Millard et al. |
| 3,997,821 A | 12/1976 | Sternbeck |
| 4,017,773 A | 4/1977 | Cheseldine |
| 4,085,435 A | 4/1978 | Galvagni |

(Continued)

FOREIGN PATENT DOCUMENTS

| | | |
|---|---|---|
| EP | 1 061 537 A2 | 12/2000 |
| GB | 1 328 780 A | 9/1973 |

(Continued)

OTHER PUBLICATIONS

Abstract of Chinese Patent—CN2742539, Nov. 23, 2005, 1 page.

(Continued)

*Primary Examiner* — Andargie M Aychillhum
(74) *Attorney, Agent, or Firm* — Dority & Manning, P.A.

(57) ABSTRACT

An electrolytic capacitor is provided that contains a capacitor element, a case, and anode and cathode terminations having first and second external components. The first external components are perpendicular to a lower surface of the case, while the second external components are parallel to the lower surface of the case and extend outwardly away from the front and rear surfaces of the case, respectively. Further, the second external components are mounted to a circuit board such that at least a portion of the capacitor is embedded in the board and such that the second external components are parallel to and in contact with a mounting surface of the circuit board. The particular arrangement of the external components of the terminations stabilizes the capacitor when it is embedded into the board to minimize flexing against the board and cracking or delamination of the capacitor.

18 Claims, 4 Drawing Sheets

(56) References Cited

U.S. PATENT DOCUMENTS

| | | |
|---|---|---|
| 4,107,762 A | 8/1978 | Shirn et al. |
| 4,247,883 A | 1/1981 | Thompson et al. |
| 4,288,842 A | 9/1981 | Voyles |
| 4,488,204 A | 12/1984 | Beck, Jr. |
| 4,497,105 A | 2/1985 | Uemura |
| 4,571,662 A | 2/1986 | Conquest et al. |
| 4,648,180 A | 3/1987 | Holt |
| 4,675,790 A | 6/1987 | DeMatos et al. |
| 4,945,452 A | 7/1990 | Sturmer et al. |
| 4,972,299 A | 11/1990 | Hagiwara et al. |
| 5,198,968 A | 3/1993 | Galvagni |
| 5,349,496 A | 9/1994 | Taniguchi et al. |
| 5,357,399 A | 10/1994 | Salisbury |
| 5,390,074 A | 2/1995 | Hasegawa et al. |
| 5,394,295 A | 2/1995 | Galvagni et al. |
| 5,457,862 A | 10/1995 | Sakata et al. |
| 5,461,537 A | 10/1995 | Kobayashi et al. |
| 5,473,503 A | 12/1995 | Sakata et al. |
| 5,495,386 A | 2/1996 | Kukkarni |
| 5,729,428 A | 3/1998 | Sakata et al. |
| 5,801,438 A | 9/1998 | Shirakawa et al. |
| 5,812,367 A | 9/1998 | Kudoh et al. |
| 5,840,086 A | 11/1998 | Takami et al. |
| 5,894,402 A | 4/1999 | Strange et al. |
| 5,943,216 A | 8/1999 | Schmidt |
| 5,949,639 A | 9/1999 | Maeda et al. |
| 6,017,367 A | 1/2000 | Nakata |
| 6,154,371 A | 11/2000 | Oba et al. |
| 6,191,936 B1 | 2/2001 | Webber et al. |
| 6,197,252 B1 | 3/2001 | Bishop et al. |
| 6,236,561 B1 | 5/2001 | Ogina et al. |
| 6,262,878 B1 | 7/2001 | Shirashige et al. |
| 6,322,912 B1 | 11/2001 | Fife |
| 6,333,844 B1 | 12/2001 | Nakamura |
| 6,346,127 B1 | 2/2002 | Kuriyama |
| 6,380,577 B1 | 4/2002 | Cadwallader |
| 6,391,275 B1 | 5/2002 | Fife |
| 6,400,556 B1 | 6/2002 | Masuda et al. |
| 6,416,730 B1 | 7/2002 | Fife |
| 6,430,034 B2 | 8/2002 | Sano et al. |
| 6,467,142 B1 | 10/2002 | Shirashige et al. |
| 6,477,030 B2 | 11/2002 | Hidaka et al. |
| 6,519,135 B2 | 2/2003 | Sano et al. |
| 6,527,937 B2 | 3/2003 | Fife |
| 6,576,099 B2 | 6/2003 | Kimmel et al. |
| 6,592,740 B2 | 7/2003 | Fife |
| 6,616,713 B2 | 9/2003 | Sano et al. |
| 6,625,009 B2 | 9/2003 | Maeda |
| 6,639,787 B2 | 10/2003 | Kimmel et al. |
| 6,665,172 B1 | 12/2003 | Kim et al. |
| 6,674,635 B1 | 1/2004 | Fife et al. |
| 6,680,841 B2 | 1/2004 | Tadanobu et al. |
| 6,717,793 B2 | 4/2004 | Arai et al. |
| 6,751,086 B2 | 6/2004 | Matsumoto |
| 6,785,147 B2 | 8/2004 | Miki et al. |
| 6,808,541 B2 | 10/2004 | Maeda |
| 6,870,727 B2 | 3/2005 | Edson et al. |
| 6,870,728 B1 | 3/2005 | Burket et al. |
| 6,882,521 B2 | 4/2005 | Tsutsui et al. |
| 6,891,717 B2 | 5/2005 | Fujii et al. |
| 6,903,921 B2 | 6/2005 | Ishijima |
| 6,903,922 B2 | 6/2005 | Sano et al. |
| 6,920,037 B2 | 7/2005 | Sano et al. |
| 6,970,345 B2 | 11/2005 | Oh et al. |
| 6,992,880 B2 | 1/2006 | Tadanobu et al. |
| 6,995,972 B2 | 2/2006 | Fujii et al. |
| 7,027,291 B2 | 4/2006 | Horio et al. |
| 7,057,882 B2 | 6/2006 | Fujii et al. |
| 7,116,548 B2 | 10/2006 | Satterfield et al. |
| 7,158,368 B2 | 1/2007 | Fujii et al. |
| 7,184,257 B2 | 2/2007 | Kobayashi et al. |
| 7,220,397 B2 | 5/2007 | Kimmel et al. |
| 7,262,511 B2 | 8/2007 | Osako et al. |
| 7,271,995 B2 | 9/2007 | Edson et al. |
| 7,341,705 B2 | 3/2008 | Schnitter |
| 7,351,915 B2 | 4/2008 | Ahn et al. |
| 7,381,396 B2 | 6/2008 | Thomas et al. |
| 7,419,926 B2 | 9/2008 | Schnitter et al. |
| 7,449,032 B2 | 11/2008 | Vaisman et al. |
| 7,570,480 B2 | 8/2009 | Kim et al. |
| 7,656,647 B2 | 2/2010 | Edson et al. |
| 7,729,102 B2 | 6/2010 | Kuriyama |
| 7,974,077 B2 | 7/2011 | Matsuoka et al. |
| 8,050,015 B2 * | 11/2011 | Niki .......... H01G 9/28 361/516 |
| 8,075,640 B2 | 12/2011 | Marek et al. |
| 8,199,462 B2 | 6/2012 | Zednicek et al. |
| 2003/0104923 A1 | 6/2003 | Omori et al. |
| 2007/0242440 A1 * | 10/2007 | Sugaya .......... H01L 23/3128 361/762 |
| 2008/0247122 A1 | 10/2008 | Vaisman et al. |
| 2008/0285209 A1 | 11/2008 | Horio |

FOREIGN PATENT DOCUMENTS

| | | |
|---|---|---|
| GB | 1 366 847 A | 9/1974 |
| GB | 1 541 049 A | 2/1979 |
| GB | 2 123 610 A | 2/1984 |
| JP | S 51-44265 | 4/1976 |

OTHER PUBLICATIONS

Abstract of Japanese Patent—JPH01227422, Sep. 11, 1989, 2 pages.
Abstract of Japanese Patent—JPH01276613, Nov. 7, 1989, 2 pages.
Abstract of Japanese Patent—JPH0287612, Mar. 28, 1990, 2 pages.
Abstract of Japanese Patent—JPH0228490, Nov. 2, 1990, 2 pages.
Abstract of Japanese Patent—JPH05234828, Sep. 10, 1993, 2 pages.
Abstract of Japanese Patent—JPH065478, Jan. 14, 1994, 2 pages.
Abstract of Japanese Patent—JPH06314885, Nov. 8, 1994, 2 pages.
Abstract of Japanese Patent—JPH07106204, Apr. 21, 1995, 2 pages.
Abstract of Japanese Patent—JPH07240343, Sep. 12, 1995, 1 page.
Abstract of Japanese Patent—JPH08130166, May 21, 1996, 2 pages.
Abstract of Japanese Patent—JPH1187175, Mar. 30, 1999, 2 pages.
Abstract of Japanese Patent—JPH11288844, Oct. 19, 1999, 2 pages.
Abstract of Japanese Patent—JP2000049048, Feb. 18, 2000, 2 pages.
Abstract of Japanese Patent—JP2001110676, Apr. 20, 2001, 2 pages.
Abstract of Japanese Patent—JP005019923, Jan. 20, 2005, 2 pages.
Abstract of Japanese Patent—JP2006032415, Feb. 2, 2006, 2 pages.
Abstract of Japanese Patent—JP2006269865, Oct. 5, 2006, 2 pages.
Abstract of Japanese Patent—JP2007134508, May 31, 2007, 2 pages.
Abstract of Japanese Patent—JP2008140976, Jun. 19, 2008, 2 pages.
Brunauer et al., "Adsorption of Gases on Multimolecular Layers," *The Journal of the American Chemical Society*, vol. 60, Jan.-Jun. 1938, pp. 309-319.

* cited by examiner

SOLID ELECTROLYTIC CAPACITOR FOR EMBEDDING INTO A CIRCUIT BOARD

BACKGROUND OF THE INVENTION

Solid electrolytic capacitors (e.g., tantalum capacitors) have been a major contributor to the miniaturization of electronic circuits and have made possible the application of such circuits in extreme environments. Many conventional solid electrolytic capacitors are formed with terminations located on a lower surface of a resin casing surrounding the capacitor element so that the capacitor can be surface mounted onto a printed circuit board, where the capacitor is thus embedded within the printed circuit board. These terminations exist in a single plane that is parallel with the lower surface of capacitor element and are present on the ends of the capacitor. Such an arrangement, however, can lead to flexing of the capacitor when mounted to a printed circuit board, where the flexing puts mechanical stress on the capacitor, which can lead to delamination and cracking of the components of the capacitor. This, in turn, leads to reduced electrical performance of the capacitor when mounted to the printed circuit board.

As such, a need remains for a solid electrolytic capacitor that can be mounted to a printed circuit board in a mechanically stable manner.

SUMMARY OF THE INVENTION

In accordance with one embodiment of the present invention, a circuit board is disclosed that includes a substrate having an upper surface and a lower surface and a solid electrolytic capacitor. The substrate defines a mounting surface on which opposing conductive members are located, where a recessed opening is provided between the conductive members. The solid electrolytic capacitor includes a capacitor element that includes an anode, a dielectric layer overlying the anode, and a cathode overlying the dielectric layer; a case that encapsulates the capacitor element, where the case includes an upper surface, a lower surface, a front surface, and a rear surface; an anode termination that is electrically connected to the anode; and a cathode termination that is electrically connected to the cathode. The anode termination contains a first external component that is generally perpendicular to the lower surface of the case and a second external component that is generally parallel to the lower surface of the case and that extends outwardly away from the front surface of the case. Further, the cathode termination contains a first external component that is generally perpendicular to the lower surface of the case and a second external component that is generally parallel to the lower surface of the case and that extends outwardly away from the rear surface of the case. The second external component of the anode termination and the second external component of the cathode termination are electrically connected to the conductive members on the substrate of the circuit board so that at least a portion of the solid electrolytic capacitor is embedded within the recessed opening. In addition, the second external component of the anode termination and the second external component of the cathode termination are generally parallel to and in contact with the circuit board's mounting surface.

In accordance with another embodiment of the present invention, a solid electrolytic capacitor is disclosed that includes a capacitor element that defines an upper surface, a lower surface, a front surface, and a rear surface; and a case that encapsulates the capacitor element, wherein the case includes an upper surface, a lower surface, a front surface, and a rear surface. The capacitor element includes an anode, a dielectric layer overlying the anode, and a cathode overlying the dielectric layer that includes a solid electrolyte; an anode termination that is electrically connected to the anode; and a cathode termination that is electrically connected to the cathode. The anode termination contains a first external component that is generally perpendicular to the lower surface of the case and a second external component that is generally parallel to the lower surface of the case and that extends outwardly away from the front surface of the case. Further, the cathode termination contains a first external component that is generally perpendicular to the lower surface of the case and a second external component that is generally parallel to the lower surface of the case and that extends outwardly away from the rear surface of the case. The second external component of the anode termination and the second external component of the cathode termination are configured to be mounted to a circuit board such that at least a portion of the capacitor is embedded in the circuit board and such that the second external component of the anode termination and the second external component of the cathode termination are generally parallel to and in contact with a mounting surface of the circuit board.

Other features and aspects of the present invention are set forth in greater detail below.

BRIEF DESCRIPTION OF THE DRAWINGS

A full and enabling disclosure of the present invention, including the best mode thereof to one skilled in the art, is set forth more particularly in the remainder of the specification, including reference to the accompanying figures, in which.

Figure 1:
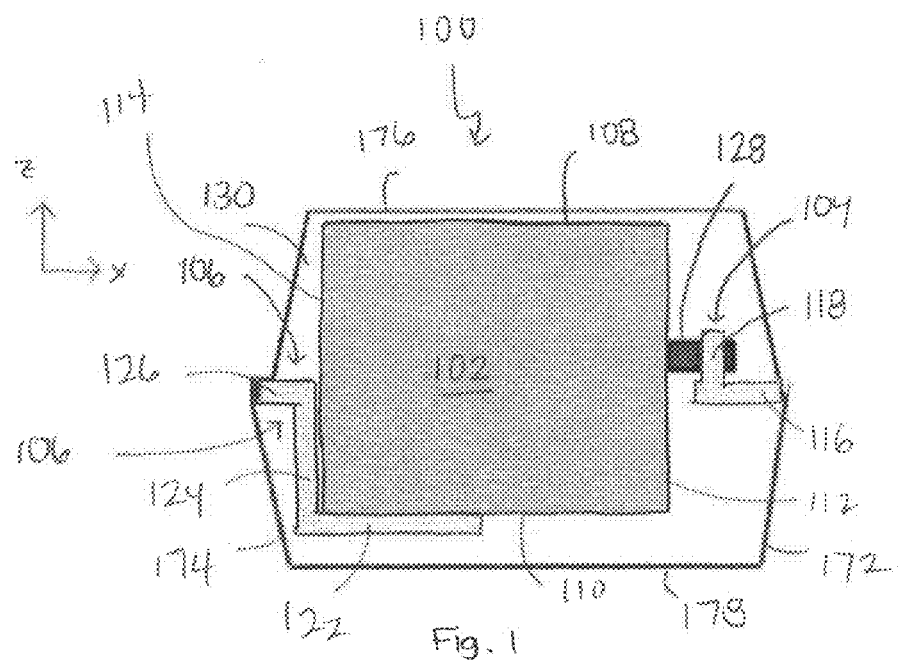
FIG. 1 is a cross-sectional view of one embodiment of the electrolytic capacitor of the present invention illustrating one arrangement for the internal anode and cathode terminations.

Repeat use of reference characters in the present specification and drawings is intended to represent the same or analogous features or elements of the present invention.

DETAILED DESCRIPTION OF REPRESENTATIVE EMBODIMENTS

It is to be understood by one of ordinary skill in the art that the present discussion is a description of exemplary embodiments only, and is not intended as limiting the broader aspects of the present invention.

Generally speaking, the present invention is directed to an electrolytic capacitor that is configured to be embedded into a circuit board. The electrolytic capacitor contains a capacitor element, a case that encapsulates the capacitor element, and an anode termination and a cathode termination each having a first external component and a second external component. The first external components of the anode termination and cathode termination are generally perpendicular to a lower surface of the case, while the second external components of the anode termination and the cathode termination are generally parallel to the lower surface of the case and extend outwardly away from the front surface of the case and the rear surface of the case, respectively. Further, the second external components of the anode termination and the cathode termination are configured to be mounted to a circuit board such that at least a portion of the capacitor is embedded in the circuit board and such that the second external component of the anode termination and the second external component of the cathode termination are generally parallel to and in contact with a mounting surface of the circuit board. The particular arrangement of the external components of the anode termination and the cathode termination stabilizes the capacitor when it is embedded in a circuit board to minimize flexing of the capacitor against the board, and cracking or delamination of the capacitor, which can result in mechanical and electrical instability.

The anode may be formed from a valve metal composition having a high specific charge, such as about 5,000 µF*V/g or more, in some embodiments about 25,000 µF*/g or more, in some embodiments about 40,000 µF*V/g or more, and in some embodiments, from about 70,000 to about 200,000 µF*V/g or more. The valve metal composition contains a valve metal (i.e., metal that is capable of oxidation) or valve metal-based compound, such as tantalum, niobium, aluminum, hafnium, titanium, alloys thereof, oxides thereof, nitrides thereof, and so forth. For example, the valve metal composition may contain an electrically conductive oxide of niobium, such as niobium oxide having an atomic ratio of niobium to oxygen of 1:1.0±1.0, in some embodiments 1:1.0±0.3, in some embodiments 1:1.0±0.1, and in some embodiments, 1:1.0±0.05. For example, the niobium oxide may be $NbO_{0.7}$, $NbO_{1.0}$, $NbO_{1.1}$, and $NbO_2$. In a preferred embodiment, the composition contains $NbO_{1.0}$, which is a conductive niobium oxide that may remain chemically stable even after sintering at high temperatures. Examples of such valve metal oxides are described in U.S. Pat. No. 6,322,912 to Fife; U.S. Pat. No. 6,391,275 to Fife et al.; U.S. Pat. No. 6,416,730 to Fife et al.; U.S. Pat. No. 6,527,937 to Fife; U.S. Pat. No. 6,576,099 to Kimmel, et al.; U.S. Pat. No. 6,592,740 to Fife, et al.; and U.S. Pat. No. 6,639,787 to Kimmel, et al.; and U.S. Pat. No. 7,220,397 to Kimmel, et al., as well as U.S. Patent Application Publication Nos. 2005/0019581 to Schnitter; 2005/0103638 to Schnitter, et al.; 2005/0013765 to Thomas, et al., all of which are incorporated herein in their entirety by reference thereto for all purposes.

Conventional fabricating procedures may generally be utilized to form the anode. In one embodiment, a tantalum or niobium oxide powder having a certain particle size is first selected. For example, the particles may be flaked, angular, nodular, and mixtures or variations thereof. The particles also typically have a screen size distribution of at least about 60 mesh, in some embodiments from about 60 to about 325 mesh, and in some embodiments, from about 100 to about 200 mesh. Further, the specific surface area is from about 0.1 to about 10.0 $m^2/g$, in some embodiments from about 0.5 to about 5.0 $m^2/g$, and in some embodiments, from about 1.0 to about 2.0 $m^2/g$. The term "specific surface area" refers to the surface area determined by the physical gas adsorption (B.E.T.) method of Bruanauer, Emmet, and Teller, Journal of American Chemical Society, Vol. 60, 1938, p. 309, with nitrogen as the adsorption gas. Likewise, the bulk (or Scott) density is typically from about 0.1 to about 5.0 $g/cm^3$, in some embodiments from about 0.2 to about 4.0 $g/cm^3$, and in some embodiments, from about 0.5 to about 3.0 $g/cm^3$.

To facilitate the construction of the anode, other components may be added to the electrically conductive particles. For example, the electrically conductive particles may be optionally mixed with a binder and/or lubricant to ensure that the particles adequately adhere to each other when pressed to form the anode body. Suitable binders may include camphor, stearic and other soapy fatty acids, Carbowax (Union Carbide), Glyptal (General Electric), polyvinyl alcohols, naphthalene, vegetable wax, and microwaxes (purified paraffins). The binder may be dissolved and dispersed in a solvent. Exemplary solvents may include water, alcohols, and so forth. When utilized, the percentage of binders and/or lubricants may vary from about 0.1% to about 8% by weight of the total mass. It should be understood, however, that binders and lubricants are not required in the present invention.

The resulting powder may be compacted using any conventional powder press mold. For example, the press mold may be a single station compaction press using a die and one or multiple punches. Alternatively, anvil-type compaction press molds may be used that use only a die and single lower punch. Single station compaction press molds are available in several basic types, such as cam, toggle/knuckle and eccentric/crank presses with varying capabilities, such as single action, double action, floating die, movable platen, opposed ram, screw, impact, hot pressing, coining or sizing. The powder may be compacted around an anode lead (e.g., tantalum wire). It should be further appreciated that the anode lead may alternatively be attached (e.g., welded) to the anode body subsequent to pressing and/or sintering of the anode body. After compression, any binder/lubricant may be removed by heating the pellet under vacuum at a certain temperature (e.g., from about 150° C. to about 500° C.) for several minutes. Alternatively, the binder/lubricant may also be removed by contacting the pellet with an aqueous solution, such as described in U.S. Pat. No. 6,197,252 to Bishop, et al., which is incorporated herein in its entirety by reference thereto for all purposes. Thereafter, the pellet is sintered to form a porous, integral mass. For example, in one embodiment, the pellet may be sintered at a temperature of from about 1200° C. to about 2000° C., and in some embodiments, from about 1500° C. to about 1800° C. under vacuum or an inert atmosphere. Upon sintering, the pellet shrinks due to the growth of bonds between the particles. In addition to the techniques described above, any other technique for constructing the anode body may also be utilized in accordance with the present invention, such as described in U.S. Pat. No. 4,085,435 to Galvagni; U.S. Pat. No. 4,945,452 to Sturmer, et al.; U.S. Pat. No. 5,198,968 to Galvagni; U.S. Pat. No. 5,357,399 to Salisbury; U.S. Pat. No. 5,394,295 to Galvagni, et al.; U.S. Pat. No. 5,495,386 to Kulkarni; and U.S. Pat. No. 6,322,912 to Fife, which are incorporated herein in their entirety by reference thereto for all purposes.

Although not required, the thickness of the anode may be selected to improve the electrical performance of the capacitor. For example, the thickness of the anode may be about 4 millimeters or less, in some embodiments, from about 0.05 to about 3.75 millimeters, and in some embodiments, from about 0.1 to about 3.5 millimeters. The shape of the anode may also be selected to improve the electrical properties of the resulting capacitor. For example, the anode may have a shape that is curved, sinusoidal, rectangular, U-shaped, V-shaped, etc. The anode may also have a "fluted" shape in that it contains one or more furrows, grooves, depressions, or indentations to increase the surface to volume ratio to minimize ESR and extend the frequency response of the capacitance. Such "fluted" anodes are described, for instance, in U.S. Pat. No. 6,191,936 to Webber, et al.; U.S. Pat. No. 5,949,639 to Maeda, et al.; and U.S. Pat. No. 3,345,545 to Bourgault et al., as well as U.S. Patent Application Publication No. 2005/0270725 to Hahn, et al., all of which are incorporated herein in their entirety by reference thereto for all purposes.

Once constructed, the anode may be anodized so that a dielectric layer is formed over and/or within the anode. Anodization is an electrochemical process by which the anode is oxidized to form a material having a relatively high dielectric constant. For example, a niobium oxide (NbO) anode may be anodized to niobium pentoxide ($Nb_2O_5$). Typically, anodization is performed by initially applying an electrolyte to the anode, such as by dipping anode into the electrolyte. The electrolyte is generally in the form of a liquid, such as a solution (e.g., aqueous or non-aqueous), dispersion, melt, etc. A solvent is generally employed in the electrolyte, such as water (e.g., deionized water); ethers (e.g., diethyl ether and tetrahydrofuran); alcohols (e.g., methanol, ethanol, n-propanol, isopropanol, and butanol); triglycerides; ketones (e.g., acetone, methyl ethyl ketone, and methyl isobutyl ketone); esters (e.g., ethyl acetate, butyl acetate, diethylene glycol ether acetate, and methoxypropyl acetate); amides (e.g., dimethylformamide, dimethylacetamide, dimethylcaprylic/capric fatty acid amide and N-alkylpyrrolidones); nitriles (e.g., acetonitrile, propionitrile, butyronitrile and benzonitrile); sulfoxides or sulfones (e.g., dimethyl sulfoxide (DMSO) and sulfolane); and so forth. The solvent may constitute from about 50 wt. % to about 99.9 wt. %, in some embodiments from about 75 wt. % to about 99 wt. %, and in some embodiments, from about 80 wt. % to about 95 wt. % of the electrolyte. Although not necessarily required, the use of an aqueous solvent (e.g., water) is often desired to help achieve the desired oxide. In fact, water may constitute about 50 wt. % or more, in some embodiments, about 70 wt. % or more, and in some embodiments, about 90 wt. % to 100 wt. % of the solvent(s) used in the electrolyte.

The electrolyte is ionically conductive and may have an ionic conductivity of about 1 milliSiemens per centimeter ("mS/cm") or more, in some embodiments about 30 mS/cm or more, and in some embodiments, from about 40 mS/cm to about 100 mS/cm, determined at a temperature of 25° C.

To enhance the ionic conductivity of the electrolyte, a compound may be employed that is capable of dissociating in the solvent to form ions. Suitable ionic compounds for this purpose may include, for instance, acids, such as hydrochloric acid, nitric acid, sulfuric acid, phosphoric acid, polyphosphoric acid, boric acid, boronic acid, etc.; organic acids, including carboxylic acids, such as acrylic acid, methacrylic acid, malonic acid, succinic acid, salicylic acid, sulfosalicylic acid, adipic acid, maleic acid, malic acid, oleic acid, gallic acid, tartaric acid, citric acid, formic acid, acetic acid, glycolic acid, oxalic acid, propionic acid, phthalic acid, isophthalic acid, glutaric acid, gluconic acid, lactic acid, aspartic acid, glutaminic acid, itaconic acid, trifluoroacetic acid, barbituric acid, cinnamic acid, benzoic acid, 4-hydroxybenzoic acid, aminobenzoic acid, etc.; sulfonic acids, such as methanesulfonic acid, benzenesulfonic acid, toluenesulfonic acid, trifluoromethanesulfonic acid, styrenesulfonic acid, naphthalene disulfonic acid, hydroxybenzenesulfonic acid, dodecylsulfonic acid, dodecylbenzenesulfonic acid, etc.; polymeric acids, such as poly(acrylic) or poly (methacrylic) acid and copolymers thereof (e.g., maleic-acrylic, sulfonic-acrylic, and styrene-acrylic copolymers), carageenic acid, carboxymethyl cellulose, alginic acid, etc.; and so forth. The concentration of ionic compounds is selected to achieve the desired ionic conductivity. For example, an acid (e.g., phosphoric acid) may constitute from about 0.01 wt. % to about 5 wt. %, in some embodiments from about 0.05 wt. % to about 0.8 wt. %, and in some embodiments, from about 0.1 wt. % to about 0.5 wt. % of the electrolyte. If desired, blends of ionic compounds may also be employed in the electrolyte.

A current is passed through the electrolyte to form the dielectric layer. The value of voltage manages the thickness of the dielectric layer. For example, the power supply may be initially set up at a galvanostatic mode until the required voltage is reached. Thereafter, the power supply may be switched to a potentiostatic mode to ensure that the desired dielectric thickness is formed over the surface of the anode. Of course, other known methods may also be employed, such as pulse or step potentiostatic methods. The voltage typically ranges from about 4 to about 200 V, and in some embodiments, from about 9 to about 100 V. During anodic oxidation, the electrolyte can be kept at an elevated temperature, such as about 30° C. or more, in some embodiments from about 40° C. to about 200° C., and in some embodiments, from about 50° C. to about 100° C. Anodic oxidation can also be done at ambient temperature or lower. The resulting dielectric layer may be formed on a surface of the anode and within its pores.

Once the dielectric layer is formed, a protective coating may optionally be applied, such as one made of a relatively insulative resinous material (natural or synthetic). Such materials may have a specific resistivity of greater than about 10 Ω/cm, in some embodiments greater than about 100, in some embodiments greater than about 1,000 Ω/cm, in some embodiments greater than about $1 \times 10^5$ Ω/cm, and in some embodiments, greater than about $1 \times 10^{10}$ Ω/cm. Some resinous materials that may be utilized in the present invention include, but are not limited to, polyurethane, polystyrene, esters of unsaturated or saturated fatty acids (e.g., glycerides), and so forth. For instance, suitable esters of fatty acids include, but are not limited to, esters of lauric acid, myristic acid, palmitic acid, stearic acid, eleostearic acid, oleic acid, linoleic acid, linolenic acid, aleuritic acid, shellolic acid, and so forth. These esters of fatty acids have been found particularly useful when used in relatively complex combinations to form a "drying oil", which allows the resulting film to rapidly polymerize into a stable layer. Such drying oils may include mono-, di-, and/or tri-glycerides, which have a glycerol backbone with one, two, and three, respectively, fatty acyl residues that are esterified. For instance, some suitable drying oils that may be used include, but are not limited to, olive oil, linseed oil, castor oil, tung oil, soybean oil, and shellac. These and other protective coating materials are described in more detail U.S. Pat. No. 6,674,635 to Fife, et al., which is incorporated herein in its entirety by reference thereto for all purposes.

The anodized part is thereafter subjected to a step for forming a cathode that includes a solid electrolyte, such as a manganese dioxide, conductive polymer, etc. A manganese dioxide solid electrolyte may, for instance, be formed by the pyrolytic decomposition of manganous nitrate ($Mn(NO_3)_2$). Such techniques are described, for instance, in U.S. Pat. No. 4,945,452 to Sturmer, et al., which is incorporated herein in its entirety by reference thereto for all purposes. Alternatively, a conductive polymer coating may be employed that contains one or more polyheterocycles (e.g., polypyrroles; polythiophenes, poly(3,4-ethylenedioxythiophene) (PEDT); polyanilines); polyacetylenes; poly-p-phenylenes; polyphenolates; and derivatives thereof. Moreover, if desired, the conductive polymer coating may also be formed from multiple conductive polymer layers. For example, in one embodiment, the conductive polymer cathode may contain one layer formed from PEDT and another layer formed from a polypyrrole. Various methods may be utilized to apply the conductive polymer coating onto the anode part. For instance, conventional techniques such as electropolymerization, screen-printing, dipping, electrophoretic coating, and spraying, may be used to form a conductive polymer coating. In one embodiment, for example, the monomer(s) used to form the conductive polymer (e.g., 3,4-ethylenedioxy-thiophene) may initially be mixed with a polymerization catalyst to form a solution. For example, one suitable polymerization catalyst is CLEVIOS C, which is iron III toluene-sulfonate and sold by H. C. Starck. CLEVIOS C is a commercially available catalyst for CLEVIOS M, which is 3,4-ethylene dioxythiophene, a PEDT monomer also sold by H. C. Starck. Once a catalyst dispersion is formed, the anode part may then be dipped into the dispersion so that the polymer forms on the surface of the anode part. Alternatively, the catalyst and monomer(s) may also be applied separately to the anode part. In one embodiment, for example, the catalyst may be dissolved in a solvent (e.g., butanol) and then applied to the anode part as a dipping solution. The anode part may then be dried to remove the solvent therefrom. Thereafter, the anode part may be dipped into a solution containing the appropriate monomer. Once the monomer contacts the surface of the anode part containing the catalyst, it chemically polymerizes thereon. In addition, the catalyst (e.g., CLEVIOS C) may also be mixed with the material(s) used to form the optional protective coating (e.g., resinous materials). In such instances, the anode part may then be dipped into a solution containing the monomer (CLEVIOS M). As a result, the monomer can contact the catalyst within and/or on the surface of the protective coating and react therewith to form the conductive polymer coating. Although various methods have been described above, it should be understood that any other method for applying the conductive coating(s) to the anode part may also be utilized in the present invention. For example, other methods for applying such conductive polymer coating(s) may be described in U.S. Pat. No. 5,457,862 to Sakata, et al., U.S. Pat. No. 5,473,503 to Sakata, et al., U.S. Pat. No. 5,729,428 to Sakata, et al., and U.S. Pat. No. 5,812,367 to Kudoh, et al., which are incorporated herein in their entirety by reference thereto for all purposes.

In most embodiments, once applied, the solid electrolyte is healed. Healing may occur after each application of a solid electrolyte layer or may occur after the application of the entire coating. In some embodiments, for example, the solid electrolyte may be healed by dipping the pellet into an electrolyte solution, such as a solution of phosphoric acid and/or sulfuric acid, and thereafter applying a constant voltage to the solution until the current is reduced to a preselected level. If desired, such healing may be accomplished in multiple steps. For instance, in one embodiment, a pellet having a conductive polymer coating is first dipped in phosphoric acid and applied with about 20 Volts and then dipped in sulfuric acid and applied with about 2 Volts. In this embodiment, the use of the second low voltage sulfuric acid solution or toluene sulfonic acid can help increase capacitance and reduce the dissipation factor (DF) of the resulting capacitor. After application of some or all of the layers described above, the pellet may then be washed if desired to remove various byproducts, excess catalysts, and so forth. Further, in some instances, drying may be utilized after some or all of the dipping operations described above. For example, drying may be desired after applying the catalyst and/or after washing the pellet in order to open the pores of the pellet so that it can receive a liquid during subsequent dipping steps.

If desired, the part may optionally be applied with a carbon layer (e.g., graphite) and silver layer, respectively. The silver coating may, for instance, act as a solderable conductor, contact layer, and/or charge collector for the capacitor and the carbon coating may limit contact of the silver coating with the solid electrolyte. Such coatings may cover some or all of the solid electrolyte.

As indicated above, the electrolytic capacitor of the present invention also contains an anode termination to which the anode lead of the capacitor element is electrically connected and a cathode termination to which the cathode of the capacitor element is electrically connected. Any conductive material may be employed to form the terminations, such as a conductive metal (e.g., copper, nickel, silver, nickel, zinc, tin, palladium, lead, copper, aluminum, molybdenum, titanium, iron, zirconium, magnesium, and alloys thereof). Particularly suitable conductive metals include, for instance, copper, copper alloys (e.g., copper-zirconium, copper-magnesium, copper-zinc, or copper-iron), nickel, and nickel alloys (e.g., nickel-iron). The thickness of the terminations is generally selected to minimize the thickness of the capacitor. For instance, the thickness of the terminations may range from about 0.05 to about 1 millimeter, in some embodiments from about 0.05 to about 0.5 millimeters, and from about 0.07 to about 0.2 millimeters. One exemplary conductive material is a copper-iron alloy metal plate available from Wieland (Germany). If desired, the surface of the terminations may be electroplated with nickel, silver, gold, tin, etc. as is known in the art to ensure that the final part is mountable to the circuit board. In one particular embodiment, both surfaces of the terminations are plated with nickel and silver flashes, respectively, while the mounting surface is also plated with a tin solder layer.

Figure 2:
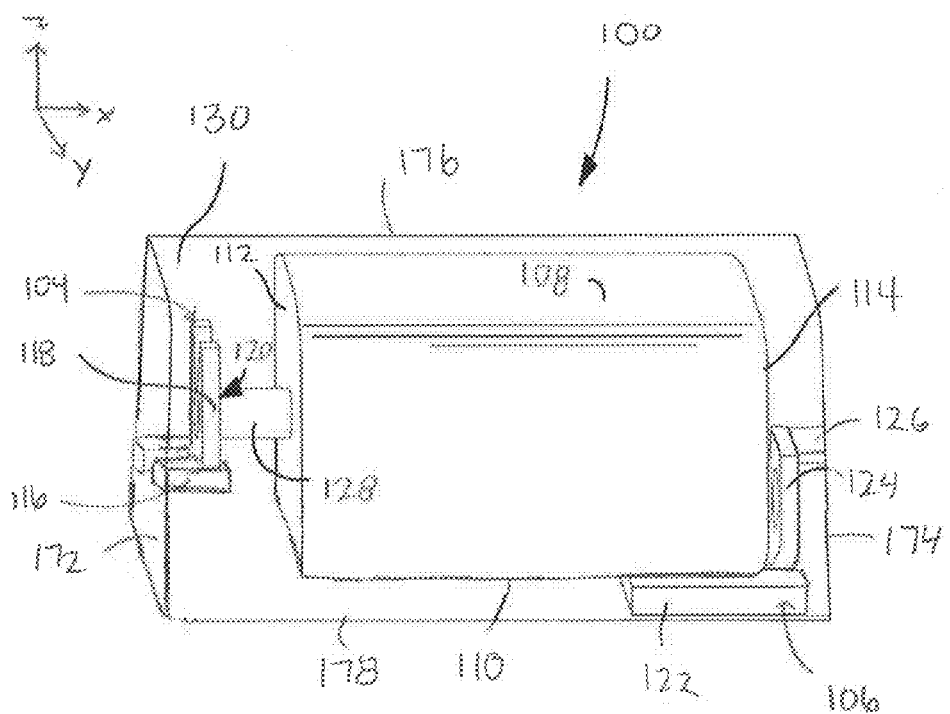
FIG. 2 is a perspective view of the electrolytic capacitor of FIG. 1.

Referring to FIGS. 1 and 2, one embodiment of an electrolytic capacitor 100 is shown that includes an anode termination 104 and a cathode termination 106 in electrical connection with a capacitor element 102. In FIGS. 1 and 2, it is to be understood that one possible configuration for the internal components of the anode termination 104 and the cathode termination 106 is described, while the external components and other alternatives for the internal components are described in FIGS. 3-8. The capacitor element 102 has an upper surface 108, a lower surface 110, a front surface 112, and a rear surface 114. Although it may be in electrical contact with any of the surfaces of the capacitor element 102, the cathode termination 106 in the illustrated embodiment is in electrical contact with the lower surface 110 and the rear surface 114. More specifically, as shown in FIGS. 1 and 2, the cathode termination 106 contains a first internal component 122 positioned generally perpendicular to a second internal component 124, as well as a third internal component 126 that is generally parallel to the first internal component 122 and that is connected to and generally perpendicular to the second internal component 124. The first internal component 122 is in electrical contact and generally parallel with the lower surface 110 of the capacitor element 102. Further, the second internal component 124 is in electrical contact and generally parallel to the rear surface 114 of the capacitor element 102, and the third internal component 126 is used to connect the internal components of the cathode termination 106 to the external components of the cathode termination 106, which are discussed in more detail below. Although depicted as being integral, it should be understood that these portions may alternatively be separate pieces that are connected together, either directly or via an additional conductive element (e.g., metal).

Referring still to FIGS. 1 and 2, the anode termination 104 contains a first internal component 116 positioned generally perpendicular to a second internal component 118. The first internal component 116 is generally parallel with the lower surface 110 of the capacitor element 102, while the second internal component 118 is generally perpendicular to the first internal component 116 and the lower surface 110 of the capacitor element 102. Further, the second internal component 118 can contain a region 120 that carries an anode lead 128. In the illustrated embodiment of FIG. 2, the region 128 possesses a "U-shape" for further enhancing surface contact and mechanical stability of the lead 128. The second internal component 118 is used to connect the internal components of the anode termination 104 to the external components of the anode termination 104, which are discussed in more detail below.

The internal components of the anode and cathode terminations may be connected to portions of the capacitor element 102 using any technique known in the art. In one embodiment, for example, a conductive adhesive may initially be applied to a surface of the first internal component 122 and second internal component 124 of the cathode termination 106. The conductive adhesive may include, for instance, conductive metal particles contained with a resin composition. The metal particles may be silver, copper, gold, platinum, nickel, zinc, bismuth, etc. The resin composition may include a thermoset resin (e.g., epoxy resin), curing agent (e.g., acid anhydride), and coupling agent (e.g., silane coupling agents). Suitable conductive adhesives may be described in U.S. Patent Application Publication No. 2006/0038304 to Osako, et al., which is incorporated herein in its entirety by reference thereto for all purposes. Any of a variety of techniques may be used to apply the conductive adhesive to the first internal component 122 and the second internal component 124 of the cathode termination 106. Printing techniques, for instance, may be employed due to their practical and cost-saving benefits.

A variety of methods may generally be employed to attach the terminations to the capacitor element. In one embodiment, for example, the second internal component 118 of the anode termination 104 and the second internal component 124 of the cathode termination 106 are initially bent upward to the position shown in FIGS. 1 and 2. Thereafter, the capacitor element 102 is positioned on the cathode termination 104 so that its lower surface 110 contacts the adhesive and the anode lead 128 is received by the upper U-shaped region 120 of the second internal component 118 of the anode termination 104.

The anode lead 128 is then electrically connected to the region 120 using any technique known in the art, such as mechanical welding, laser welding, conductive adhesives, etc. For example, the anode lead 128 may be welded to the second internal component 118 of the anode termination 104 using a laser.

Lasers generally contain resonators that include a laser medium capable of releasing photons by stimulated emission and an energy source that excites the elements of the laser medium. One type of suitable laser is one in which the laser medium consist of an aluminum and yttrium garnet (YAG), doped with neodymium (Nd). The excited particles are neodymium ions $Nd^{3+}$. The energy source may provide continuous energy to the laser medium to emit a continuous laser beam or energy discharges to emit a pulsed laser beam. Upon electrically connecting the anode lead 128 to the anode termination 104, the conductive adhesive may then be cured. For example, a heat press may be used to apply heat and pressure to ensure that the electrolytic capacitor element 102 is adequately adhered to the first internal component 122 and the second internal component 124 of the cathode termination 106 by the adhesive.

Once the capacitor element 102 is attached, the internal components of the anode termination 104 and cathode termination 106 are enclosed within a resin case 130 having a front surface 172, a rear surface 174, an upper surface 176, and a lower surface 178, which may then be filled with silica or any other known encapsulating material. The width and length of the case may vary depending on the intended application. Suitable casings may include, for instance, "A", "B", "E", "F" "G" "H" "J" "K", "L", "M", "N" "P" "R" "S" "T" "W" "Y" or "X" cases (AVX Corporation). Regardless of the case size employed, the capacitor element is encapsulated so that at least a portion of the anode termination 104 and cathode termination 106 are exposed for mounting onto respective conductive members 170 of a printed circuit board 160 that includes a substrate 168 having an upper surface 164 and a lower surface 166 and defining an opening 162 in which at least a portion of an electrolytic capacitor can be embedded, as shown in FIGS. 3-8.

Figure 3:
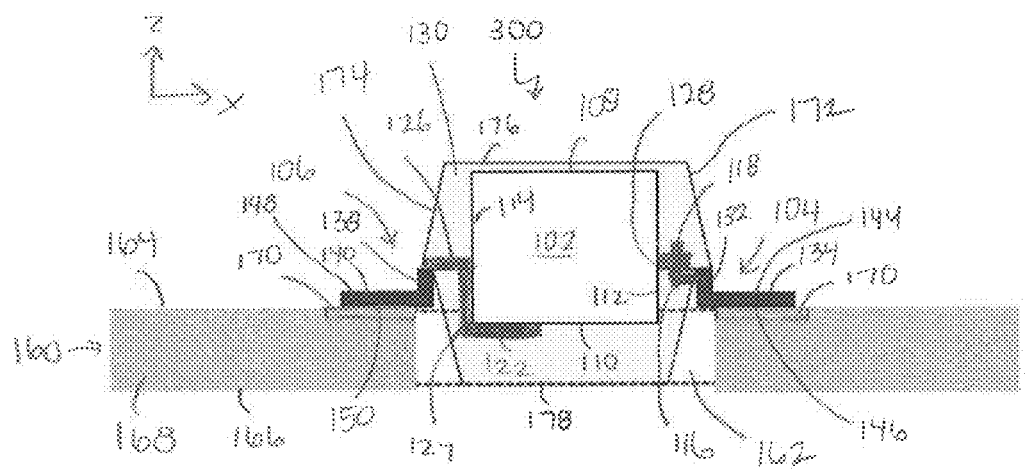
FIG. 3 is a cross-sectional view of one embodiment of the electrolytic capacitor of the present invention, illustrating one manner of mounting the capacitor onto a single-sided printed circuit board via the external components of the anode termination and cathode termination.

Turning now to FIG. 3, for instance, in one particular embodiment contemplated by the present invention, an electrolytic capacitor 300 includes a capacitor element 102 that is encapsulated in a case 130. The electrolytic capacitor 300 has an anode termination 104 that includes a first internal component 116 and a second internal component 118 as described above with respect to FIGS. 1 and 2. The anode termination 104 also includes a first external component 132 and a second external component 134. The first external component 132 is electrically connected to the first internal component 116 of the anode termination 104 and is generally perpendicular to the lower surface 178 of the case 130. Meanwhile, the second external component 134 of the anode termination 104, which is connected to the first external component 132, is generally parallel to the lower surface 178 of the case 130 and extends outwardly away from the front surface 172 of the case 130. Further, the electrolytic capacitor 300 has a cathode termination 106 that includes a first internal component 122, a second internal component 124, and a third internal component 126 as described above with respect to FIGS. 1 and 2. In addition, the cathode termination 106 also includes a first external component 138 and a second external component 140. The first external component 138 is electrically connected to the third internal component 126 of the cathode termination 106 and is generally perpendicular to the lower surface 178 of the case 130. Meanwhile, the second external component 140 of the cathode termination 106, which is connected to the first external component 138, is generally parallel to the lower surface 178 of the case 130 and extends outwardly away from the rear surface 174 of the case 130.

Once formed, the capacitor 300 may then be mounted onto a circuit board 160 that contains a substrate 168 (e.g., insulating layer) having an upper surface 164 and a lower surface 166 and that defines a recessed opening 162 and conductive members 170. More specifically, the second external component 134 of the anode termination 104 defines an upper surface 144 and a lower surface 146, and the second external component 140 of the cathode termination 106 defines and upper surface 148 and a lower surface 150. The lower surfaces 146 and 150 are configured for mounting the generally coplanar second external component 134 of the anode termination 104 and the second external component 140 of the cathode termination 106 onto the conductive members 170 on the upper surface 164 of the substrate 168 so that at least a portion of the case 130 fits within the recessed opening 162. As shown, the upper surface 164 of the substrate 168 serves as the mounting surface, and the second external component 134 of the anode termination 104 and the second external component 140 of the cathode termination 106 are generally parallel to and an in contact with the upper surface 164. In the specific embodiment of FIG. 3, which represents a single-sided printed circuit board, the lower surface 178 of the case 130 is generally coplanar with the lower surface 166 of the substrate 168, while the upper surface 176 of the case 130 extends above an upper surface 164 of the substrate 168. In this manner, the capacitor 300 may be mounted so that some or all of its thickness becomes embedded within the circuit board 160 itself, thereby minimizing the height profile of the capacitor 300 on the circuit board 160, where the specific arrangement of the external components of the anode and cathode terminations provide improve the mechanical stability of the mounted capacitor 300. It should be understood that various other electronic components may also be mounted onto upper surface 164 of the circuit board 160 as is well known in the art and that the single capacitor 300 is shown only for purposes of illustration. Moreover, it should be understood that the capacitor 300 and any other components can be attached the circuit board 160 using known techniques, such as by soldering.

Figure 4:
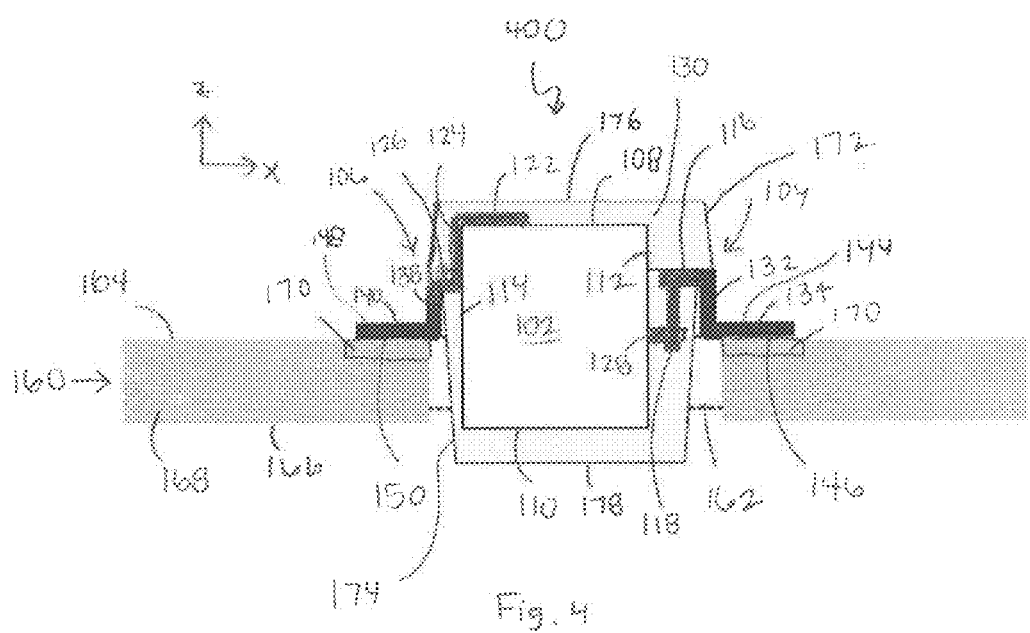
FIG. 4 is a cross-sectional view of another embodiment of the electrolytic capacitor of the present invention, illustrating one manner of mounting the capacitor onto a double-sided printed circuit board via the external components of the anode termination and cathode termination.

Referring now to FIG. 4, for instance, in another particular embodiment contemplated by the present invention, an electrolytic capacitor 400 includes a capacitor element 102 that is encapsulated in a case 130. The electrolytic capacitor 400 has an anode termination 104 that includes a first internal component 116 and a second internal component 118 as described above with respect to FIGS. 1-3, but with a slightly different arrangement such that the first internal component 116 is positioned between the anode lead 128 and the upper surface 108 of the capacitor element 102 instead of between the anode lead 128 and the lower surface 110 of the capacitor element 102 as in FIGS. 1-3, with the understanding that any suitable arrangement known by one of ordinary skill in the art can be utilized for the arrangement of the internal components of the anode termination 104. The anode termination 104 also includes a first external component 132 and a second external component 134. The first external component 132 is electrically connected to the first internal component 116 of the anode termination 104 and is generally perpendicular to the lower surface 178 of the case 130. Meanwhile, the second external component 134 of the anode termination 104, which is connected to the first external component 132, is generally parallel to the lower surface 178 of the case 130 and extends outwardly away from the front surface 172 of the case 130. Further, the electrolytic capacitor 400 has a cathode termination 106 that includes a first internal component 122, a second internal component 124, and a third internal component 126 as described above with respect to FIGS. 1-3, but with a slightly different arrangement. For instance, in FIG. 4, the first internal component 122 is in electrical contact and generally parallel with the upper surface 108 of the capacitor element 102. However, like FIGS. 1-3, the second internal component 124 is in electrical contact and generally parallel to the rear surface 114 of the capacitor element 102, and the third internal component 126 is used to connect the internal components of the cathode termination 106 to the external components of the cathode termination 106, with the understanding that any suitable arrangement known by one of ordinary skill in the art can be utilized for the arrangement of the internal components of the cathode termination 106. In addition, the cathode termination 106 also includes a first external component 138 and a second external component 140. The first external component 138 is electrically connected to the third internal component 126 of the cathode termination 106 and is generally perpendicular to the lower surface 178 of the case 130. Meanwhile, the second external component 140 of the cathode termination 106, which is connected to the first external component 138, is generally parallel to the lower surface 178 of the case 130 and extends outwardly away from the rear surface 174 of the case 130.

Once formed, the capacitor 400 may then be mounted onto a circuit board 160 that contains a substrate 168 (e.g., insulating layer) having an upper surface 164 and a lower surface 166 and that defines a recessed opening 162 and conductive members 170. More specifically, the second external component 134 of the anode termination 104 defines an upper surface 144 and a lower surface 146, and the second external component 140 of the cathode termination 106 defines and upper surface 148 and a lower surface 150. The lower surfaces 146 and 150 are configured for mounting the generally coplanar second external component 134 of the anode termination 104 and the second external component 140 of the cathode termination 106 onto the conductive members 170 on the upper surface 164 of the substrate 168 so that a portion of the case 130 fits within the recessed opening 162. As shown, the upper surface 164 of the substrate 168 serves as the mounting surface, and the second external component 134 of the anode termination 104 and the second external component 140 of the cathode termination 106 are generally parallel to and an in contact with the upper surface 164. In the specific embodiment of FIG. 4, which represents a double-sided printed circuit board, the lower surface 178 of the case 130 extends below the lower surface 166 of the substrate 168, while the upper surface 176 of the case 130 extends above an upper surface 164 of the substrate 168. In this manner, the capacitor 400 may be mounted so that a portion of its thickness becomes embedded within the circuit board 160 itself, thereby minimizing the height profile of the capacitor 400 on the circuit board 160, where the specific arrangement of the external components of the anode and cathode terminations provide improve the mechanical stability of the mounted capacitor 400. It should be understood that various other electronic components may also be mounted onto upper surface 164 and lower surface 166 of the circuit board 160 as is well known in the art and that the single capacitor 400 is shown only for purposes of illustration. Moreover, it should be understood that the capacitor 400 and any other components can be attached the circuit board 160 using known techniques, such as by soldering.

Figure 5:
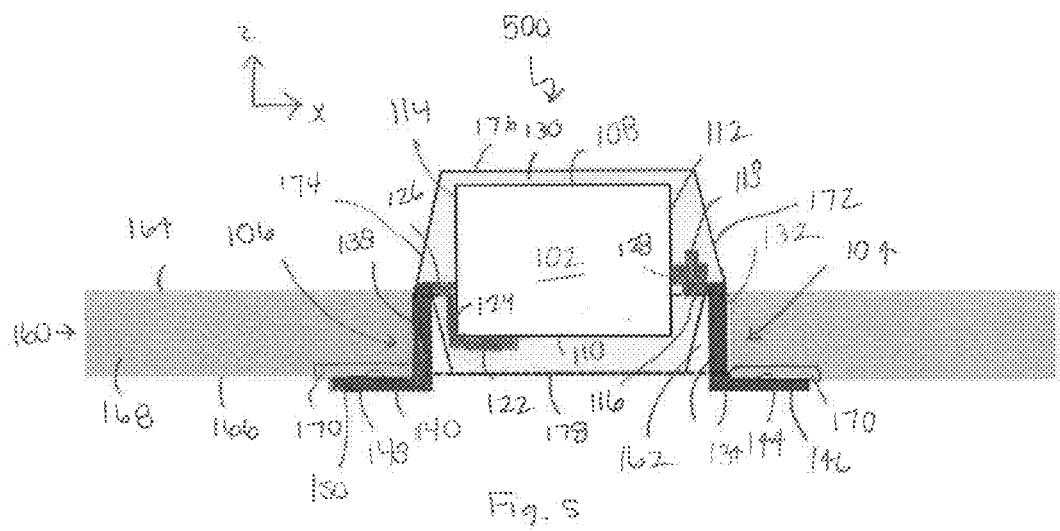
FIG. 5 is a cross-sectional view of yet another embodiment of the electrolytic capacitor of the present invention, illustrating one manner of mounting the capacitor onto a single-sided printed circuit board via the external components of the anode termination and cathode termination.

Turning now to FIG. 5, for instance, in still another particular embodiment contemplated by the present invention, an electrolytic capacitor 500 includes a capacitor element 102 that is encapsulated in a case 130. The electrolytic capacitor 500 has an anode termination 104 that includes a first internal component 116 and a second internal component 118 as described above with respect to FIGS. 1 and 2. The anode termination 104 also includes a first external component 132 and a second external component 134. The first external component 132 is electrically connected to the first internal component 116 of the anode termination 104 and is generally perpendicular to the lower surface 178 of the case 130. Meanwhile, the second external component 134 of the anode termination 104, which is connected to the first external component 132, is generally parallel to the lower surface 178 of the case 130 and extends outwardly away from the front surface 172 of the case 130. Further, the electrolytic capacitor 500 has a cathode termination 106 that includes a first internal component 122, a second internal component 124, and a third internal component 126 as described above with respect to FIGS. 1 and 2. In addition, the cathode termination 106 also includes a first external component 138 and a second external component 140. The first external component 138 is electrically connected to the third internal component 126 of the cathode termination 106 and is generally perpendicular to the lower surface 178 of the case 130. Meanwhile, the second external component 140 of the cathode termination 106, which is connected to the first external component 138, is generally parallel to the lower surface 178 of the case 130 and extends outwardly away from the rear surface 174 of the case 130.

Once formed, the capacitor 500 may then be mounted onto a circuit board 160 that contains a substrate 168 (e.g., insulating layer) having an upper surface 164 and a lower surface 166 and that defines a recessed opening 162 and conductive members 170. More specifically, the second external component 134 of the anode termination 104 defines an upper surface 144 and a lower surface 146, and the second external component 140 of the cathode termination 106 defines and upper surface 148 and a lower surface 150. The upper surfaces 144 and 148 are configured for mounting the generally coplanar second external component 134 of the anode termination 104 and the second external component 140 of the cathode termination 106 onto the conductive members 170 on the lower surface 166 of the substrate 168 so that at least a portion of the case 130 fits within the recessed opening 162. As shown, the lower surface 166 of the substrate 168 serves as the mounting surface, and the second external component 134 of the anode termination 104 and the second external component 140 of the cathode termination 106 are generally parallel to and an in contact with the lower surface 166. In the specific embodiment of FIG. 5, which represents a single-sided printed circuit board, the lower surface 178 of the case 130 is generally coplanar with the lower surface 166 of the substrate 168, while the upper surface 176 of the case 130 extends above an upper surface 164 of the substrate 168. In this manner, the capacitor 500 may be mounted so that some or all of its thickness becomes embedded within the circuit board 160 itself, thereby minimizing the height profile of the capacitor 500 on the circuit board 160, where the specific arrangement of the external components of the anode and cathode terminations provide improve the mechanical stability of the mounted capacitor 500. It should be understood that various other electronic components may also be mounted onto upper surface 164 of the circuit board 160 as is well known in the art and that the single capacitor 500 is shown only for purposes of illustration. Moreover, it should be understood that the capacitor 500 and any other components can be attached the circuit board 160 using known techniques, such as by soldering.

Figure 6:
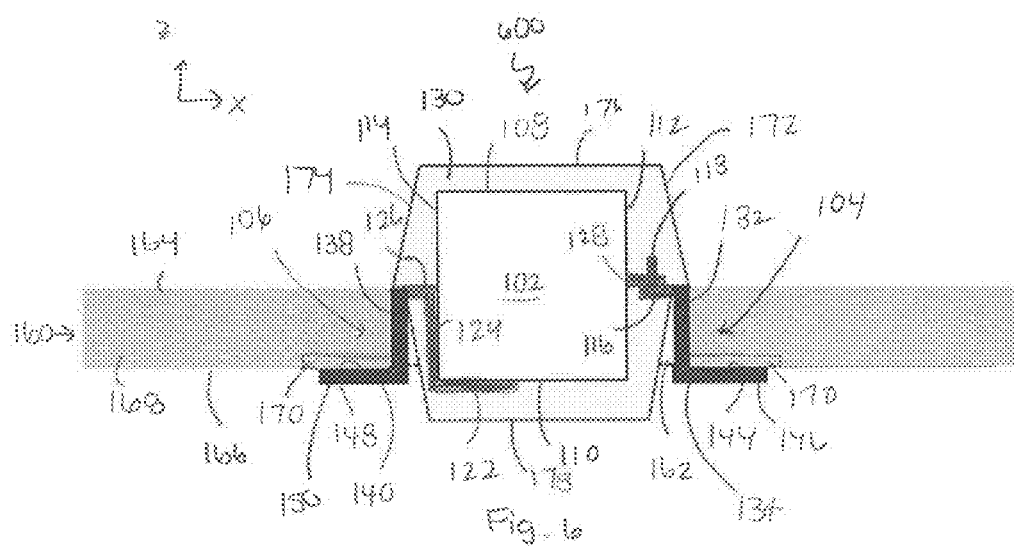
FIG. 6 is a cross-sectional view of an additional embodiment of the electrolytic capacitor of the present invention, illustrating one manner of mounting the capacitor onto a double-sided printed circuit board via the external components of the anode termination and cathode termination.

Referring now to FIG. 6, for instance, in still another particular embodiment contemplated by the present invention, an electrolytic capacitor 600 includes a capacitor element 102 that is encapsulated in a case 130. The electrolytic capacitor 600 has an anode termination 104 that includes a first internal component 116 and a second internal component 118 as described above with respect to FIGS. 1 and 2. The anode termination 104 also includes a first external component 132 and a second external component 134. The first external component 132 is electrically connected to the first internal component 116 of the anode termination 104 and is generally perpendicular to the lower surface 178 of the case 130. Meanwhile, the second external component 134 of the anode termination 104, which is connected to the first external component 132, is generally parallel to the lower surface 178 of the case 130 and extends outwardly away from the front surface 172 of the case 130. Further, the electrolytic capacitor 600 has a cathode termination 106 that includes a first internal component 122, a second internal component 124, and a third internal component 126 as described above with respect to FIGS. 1 and 2. In addition, the cathode termination 106 also includes a first external component 138 and a second external component 140. The first external component 138 is electrically connected to the third internal component 126 of the cathode termination 106 and is generally perpendicular to the lower surface 178 of the case 130. Meanwhile, the second external component 140 of the cathode termination 106, which is connected to the first external component 138, is generally parallel to the lower surface 178 of the case 130 and extends outwardly away from the rear surface 174 of the case 130.

Once formed, the capacitor 600 may then be mounted onto a circuit board 160 that contains a substrate 168 (e.g., insulating layer) having an upper surface 164 and a lower surface 166 and that defines a recessed opening 162 and conductive members 170. More specifically, the second external component 134 of the anode termination 104 defines an upper surface 144 and a lower surface 146, and the second external component 140 of the cathode termination 106 defines and upper surface 148 and a lower surface 150. The upper surfaces 144 and 148 are configured for mounting the generally coplanar second external component 134 of the anode termination 104 and the second external component 140 of the cathode termination 106 onto the conductive members 170 on the lower surface 166 of the substrate 168 so that at a portion of the case 130 fits within the recessed opening 162. As shown, the lower surface 166 of the substrate 168 serves as the mounting surface, and the second external component 134 of the anode termination 104 and the second external component 140 of the cathode termination 106 are generally parallel to and an in contact with the lower surface 166. In the specific embodiment of FIG. 6, which represents a double-sided printed circuit board, the lower surface 178 of the case 130 extends below the lower surface 166 of the substrate 168, while the upper surface 176 of the case 130 extends above an upper surface 164 of the substrate 168. In this manner, the capacitor 600 may be mounted so that a portion of its thickness becomes embedded within the circuit board 160 itself, thereby minimizing the height profile of the capacitor 600 on the circuit board 160, where the specific arrangement of the external components of the anode and cathode terminations provide improve the mechanical stability of the mounted capacitor 600. It should be understood that various other electronic components may also be mounted onto upper surface 164 and lower surface 166 of the circuit board 160 as is well known in the art and that the single capacitor 600 is shown only for purposes of illustration. Moreover, it should be understood that the capacitor 600 and any other components can be attached the circuit board 160 using known techniques, such as by soldering.

Figure 7:
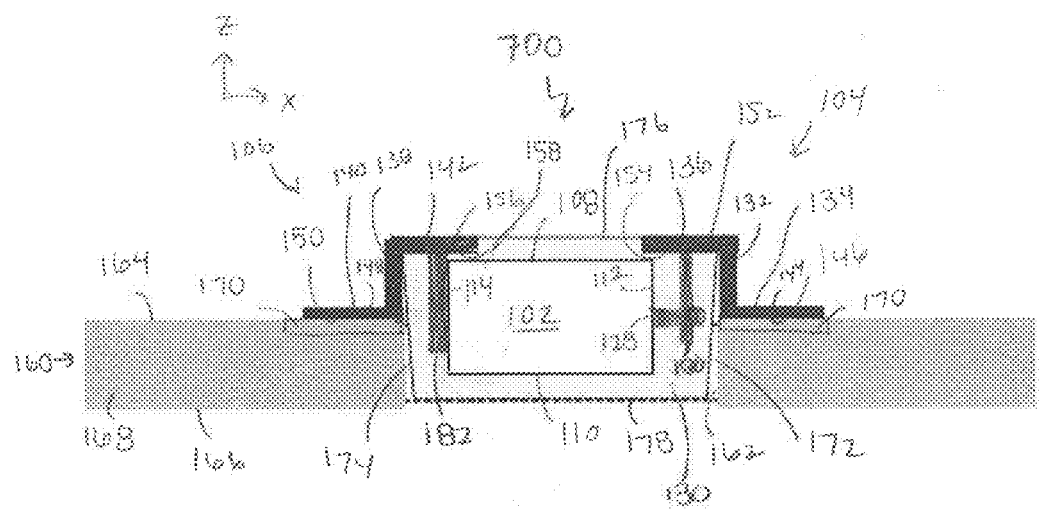
FIG. 7 is a cross-sectional view of still another embodiment of the electrolytic capacitor of the present invention, illustrating one manner of mounting the capacitor onto a single-sided printed circuit board via the external components of the anode termination and cathode termination.

Turning now to FIG. 7, in yet another embodiment contemplated by the present invention, an electrolytic capacitor 700 includes a capacitor element 102 that is encapsulated in a case 130. The electrolytic capacitor 700 has an anode termination 104 that includes a first internal component 180 that is generally perpendicular to the lower surface 110 of the capacitor element 102. Further, the first internal component 180 can contain a region (not shown) that carries an anode lead 128, which can possess a "U-shape" for further enhancing surface contact and mechanical stability of the lead 128. The first internal component 180 is connected and positioned generally perpendicular to a second internal component 136, which is used to connect the internal components of the anode termination 104 to the external components of the anode termination 104. As shown, the second internal component 136 is generally parallel to the upper surface 176 of the case 130, where a lower surface 154 of the second internal component 136 is contained within the resin casing 130 and an upper surface 152 of the second internal component 136 is generally exposed, with the understanding that any suitable arrangement known by one of ordinary skill in the art can be utilized for the arrangement of the internal components of the anode termination 104. The anode termination 104 also includes a first external component 132 and a second external component 134. The first external component 132 is electrically connected to the second internal component 136 of the anode termination 104 and is generally perpendicular to the lower surface 178 of the case 130. Meanwhile, the second external component 134 of the anode termination 104, which is also connected to the first external component 132, is generally parallel to the lower surface 178 of the case 130 and extends outwardly away from the front surface 172 of the case 130.

Further, the electrolytic capacitor 700 has a cathode termination 106 that includes a first internal component 182 that is generally perpendicular to the lower surface 110 of the capacitor element 102 and a second internal component 142 that includes an upper surface 156 and a lower surface 158, where the second internal component 142 is generally parallel to the upper surface 176 of the case 130. The first internal component 182 is connected and positioned generally perpendicular to the second internal component 142, which is used to connect the internal components of the cathode termination 106 to the external components of the cathode termination 106. As shown, the second internal component 142 is generally parallel to the upper surface 176 of the case 130, where the lower surface 158 of the second internal component 142 is contained within the resin casing 130 and the upper surface 156 of the second internal component 142 is generally exposed, with the understanding that any suitable arrangement known by one of ordinary skill in the art can be utilized for the arrangement of the internal components of the cathode termination 106. In addition, the cathode termination 106 also includes a first external component 138 and a second external component 140. The first external component 138 is electrically connected to the second internal component 142 of the cathode termination 106 and is generally perpendicular to the lower surface 178 of the case 130. Meanwhile, the second external component 140 of the cathode termination 106, which is connected to the first external component 138, is generally parallel to the lower surface 178 of the case 130 and extends outwardly away from the rear surface 174 of the case 130.

Once formed, the capacitor 700 may then be mounted onto a circuit board 160 that contains a substrate 168 (e.g., insulating layer) having an upper surface 164 and a lower surface 166 and that defines a recessed opening 162 and conductive members 170. More specifically, the second external component 134 of the anode termination 104 defines an upper surface 144 and a lower surface 146, and the second external component 140 of the cathode termination 106 defines and upper surface 148 and a lower surface 150. The lower surfaces 146 and 150 are configured for mounting the generally coplanar second external component 134 of the anode termination 104 and the second external component 140 of the cathode termination 106 onto the conductive members 170 on the upper surface 164 of the substrate 168 so that at least a portion of the case 130 fits within the recessed opening 162. As shown, the upper surface 164 of the substrate 168 serves as the mounting surface, and the second external component 134 of the anode termination 104 and the second external component 140 of the cathode termination 106 are generally parallel to and an in contact with the upper surface 164. In the specific embodiment of FIG. 7, which represents a single-sided printed circuit board, the lower surface 178 of the case 130 is generally coplanar with the lower surface 166 of the substrate 168, while the upper surface 176 of the case 130 extends above an upper surface 164 of the substrate 168. In this manner, the capacitor 700 may be mounted so that some or all of its thickness becomes embedded within the circuit board 160 itself, thereby minimizing the height profile of the capacitor 700 on the circuit board 160, where the specific arrangement of the external components of the anode and cathode terminations provide improve the mechanical stability of the mounted capacitor 700. It should be understood that various other electronic components may also be mounted onto upper surface 164 of the circuit board 160 as is well known in the art and that the single capacitor 700 is shown only for purposes of illustration. Moreover, it should be understood that the capacitor 700 and any other components can be attached the circuit board 160 using known techniques, such as by soldering.

Figure 8:
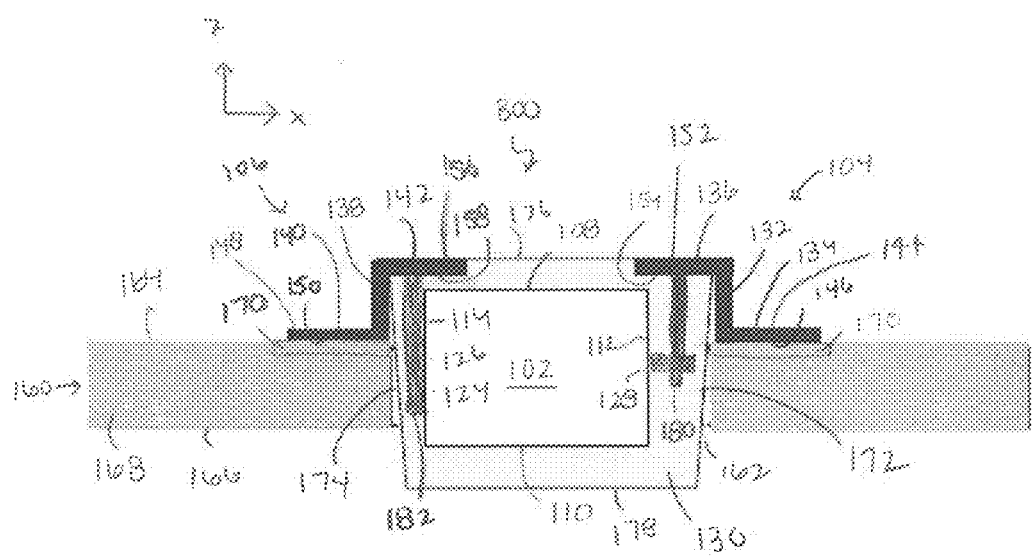
FIG. 8 is a cross-sectional view of one more embodiment of the electrolytic capacitor of the present invention, illustrating one manner of mounting the capacitor onto a double-sided printed circuit board via the external components of the anode termination and cathode termination.

Referring now to FIG. 8, in an additional embodiment contemplated by the present invention, an electrolytic capacitor 800 includes a capacitor element 102 that is encapsulated in a case 130. The electrolytic capacitor 800 has an anode termination 104 that includes a first internal component 180 that is generally perpendicular to the lower surface 110 of the capacitor element 102. Further, the first internal component 180 can contain a region (not shown) that carries an anode lead 128, which can possess a "U-shape" for further enhancing surface contact and mechanical stability of the lead 128. The first internal component 180 is connected and positioned generally perpendicular to a second internal component 136, which is used to connect the internal components of the anode termination 104 to the external components of the anode termination 104. As shown, the second internal component 136 is generally parallel to the upper surface 176 of the case 130, where a lower surface 154 of the second internal component 136 is contained within the resin casing 130 and an upper surface 152 of the second internal component 136 is generally exposed, with the understanding that any suitable arrangement known by one of ordinary skill in the art can be utilized for the arrangement of the internal components of the anode termination 104. The anode termination 104 also includes a first external component 132 and a second external component 134. The first external component 132 is electrically connected to the second internal component 136 of the anode termination 104 and is generally perpendicular to the lower surface 178 of the case 130. Meanwhile, the second external component 134 of the anode termination 104, which is also connected to the first external component 132, is generally parallel to the lower surface 178 of the case 130 and extends outwardly away from the front surface 172 of the case 130.

Further, the electrolytic capacitor 800 has a cathode termination 106 that includes a first internal component 182 that is generally perpendicular to the lower surface 110 of the capacitor element 102 and a second internal component 142 that includes an upper surface 156 and a lower surface 158, where the second internal component 142 is generally parallel to the upper surface 176 of the case 130. The first internal component 182 is connected and positioned generally perpendicular to the second internal component 142, which is used to connect the internal components of the cathode termination 106 to the external components of the cathode termination 106. As shown, the second internal component 142 is generally parallel to the upper surface 176 of the case 130, where the lower surface 158 of the second internal component 142 is contained within the resin casing 130 and the upper surface 156 of the second internal component 142 is generally exposed, with the understanding that any suitable arrangement known by one of ordinary skill in the art can be utilized for the arrangement of the internal components of the cathode termination 106. In addition, the cathode termination 106 also includes a first external component 138 and a second external component 140. The first external component 138 is electrically connected to the second internal component 142 of the cathode termination 106 and is generally perpendicular to the lower surface 178 of the case 130. Meanwhile, the second external component 140 of the cathode termination 106, which is connected to the first external component 138, is generally parallel to the lower surface 178 of the case 130 and extends outwardly away from the rear surface 174 of the case 130.

Once formed, the capacitor 800 may then be mounted onto a circuit board 160 that contains a substrate 168 (e.g., insulating layer) having an upper surface 164 and a lower surface 166 and that defines a recessed opening 162 and conductive members 170. More specifically, the second external component 134 of the anode termination 104 defines an upper surface 144 and a lower surface 146, and the second external component 140 of the cathode termination 106 defines and upper surface 148 and a lower surface 150. The lower surfaces 146 and 150 are configured for mounting the generally coplanar second external component 134 of the anode termination 104 and the second external component 140 of the cathode termination 106 onto the conductive members 170 on the upper surface 164 of the substrate 168 so that at least a portion of the case 130 fits within the recessed opening 162. As shown, the upper surface 164 of the substrate 168 serves as the mounting surface, and the second external component 134 of the anode termination 104 and the second external component 140 of the cathode termination 106 are generally parallel to and an in contact with the upper surface 164. In the specific embodiment of FIG. 8, which represents a double-sided printed circuit board, the lower surface 178 of the case 130 extends below the lower surface 166 of the substrate 168, while the upper surface 176 of the case 130 extends above an upper surface 164 of the substrate 168. In this manner, the capacitor 800 may be mounted so that a portion of its thickness becomes embedded within the circuit board 160 itself, thereby minimizing the height profile of the capacitor 800 on the circuit board 160, where the specific arrangement of the external components of the anode and cathode terminations provide improve the mechanical stability of the mounted capacitor 800. It should be understood that various other electronic components may also be mounted onto upper surface 164 and lower surface 166 of the circuit board 160 as is well known in the art and that the single capacitor 800 is shown only for purposes of illustration. Moreover, it should be understood that the capacitor 800 and any other components can be attached the circuit board 160 using known techniques, such as by soldering.

The degree of which the capacitors shown in FIGS. 1-8 are embedded depends on a variety of factors, such as the thickness of the board 160, the case size, etc. The thickness of the casing may be, for instance, from about 0.05 to about 5 millimeters, in some embodiments, from about 0.1 to about 4.5 millimeters, and in some embodiments, from about 0.2 to about 4.3 millimeters. Likewise, the thickness of the circuit board (not including the attached electrical components) may be from about 0.1 to about 5 millimeters, in some embodiments, from about 0.2 to about 3 millimeters, and in some embodiments, from about 0.4 to about 2 millimeters. Thus, depending on the particular thicknesses employed, the capacitor may be embedded in an opening 162 of the printed circuit board 160 so that the lower surface 178 of the case 130 is generally coplanar with the lower surface 166 of the substrate 168 (see FIGS. 3, 5, and 7), while the upper surface 176 of the case 130 extends slightly above the upper surface 164 of the printed circuit board substrate 168. Alternatively, the capacitor may be embedded so that the lower surface 178 of the case 130 extends slightly below the lower surface 166 of the printed circuit board substrate 168 (see FIGS. 4, 6, and 8).

These and other modifications and variations of the present invention may be practiced by those of ordinary skill in the art, without departing from the spirit and scope of the present invention. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. A circuit board comprising: a substrate having an upper surface and a lower surface, wherein the substrate defines a mounting surface on which opposing conductive members are located, wherein a recessed opening is provided between the conductive members; and a solid electrolytic capacitor comprising a capacitor element that includes an anode, a dielectric layer overlying the anode, and a cathode overlying the dielectric layer; a case that encapsulates the capacitor element, wherein the case includes an upper surface, a lower surface, a front surface, and a rear surface; an anode termination that is electrically connected to the anode, the anode termination containing a first external component that is generally perpendicular to the lower surface of the case and a second external component that is generally parallel to the lower surface of the case and that extends outwardly away from the front surface of the case; and a cathode termination that is electrically connected to the cathode, the cathode termination containing a first external component that is generally perpendicular to the lower surface of the case and a second external component that is generally parallel to the lower surface of the case and that extends outwardly away from the rear surface of the case; wherein the second external component of the anode termination and the second external component of the cathode termination are electrically connected to the conductive members so that at least a portion of the solid electrolytic capacitor is embedded within the recessed opening, further wherein the second external component of the anode termination and the second external component of the cathode termination are generally parallel to and in contact with the mounting surface, wherein the second external component of the anode termination and the second external component of the cathode termination are generally coplanar.

2. The circuit board of claim 1, wherein the upper surface of the substrate is the mounting surface such that the conductive members are located on the upper surface of the substrate.

3. The circuit board of claim 1, wherein the lower surface of the substrate is the mounting surface such that the conductive members are located on the lower surface of the substrate.

4. The circuit board of claim 1, wherein the upper surface of the case extends above the upper surface of the substrate.

5. The circuit board of claim 4, wherein the lower surface of the case is generally coplanar with the lower surface of the substrate.

6. The circuit board of claim 4, wherein the lower surface of the case extends below the lower surface of the substrate.

7. The circuit board of claim 1, wherein the anode includes tantalum, niobium, or an electrically conductive oxide thereof.

8. The circuit board of claim 1, wherein an anode lead is electrically connected to the anode.

9. The circuit board of claim 1, wherein the cathode includes a solid electrolyte.

10. The circuit board of claim 9, wherein the solid electrolyte includes manganese dioxide, a conductive polymer, or a combination thereof.

11. A solid electrolytic capacitor comprising: a capacitor element that defines an upper surface, a lower surface, a front surface, and a rear surface, wherein the capacitor element includes an anode, a dielectric layer overlying the anode, and a cathode overlying the dielectric layer that includes a solid electrolyte; a case that encapsulates the capacitor element, wherein the case includes an upper surface, a lower surface, a front surface, and a rear surface; an anode termination that is electrically connected to the anode, the anode termination containing a first external component that is generally perpendicular to the lower surface of the case and a second external component that is generally parallel to the lower surface of the case and that extends outwardly away from the front surface of the case; a cathode termination that is electrically connected to the cathode, the cathode termination containing a first external component that is generally perpendicular to the lower surface of the case and a second external component that is generally parallel to the lower surface of the case and that extends outwardly away from the rear surface of the case; wherein the second external component of the anode termination and the second external component of the cathode termination are configured to be mounted to a circuit board such that at least a portion of the capacitor is embedded in the circuit board and such that the second external component of the anode termination and the second external component of the cathode termination are generally parallel to and in contact with a mounting surface of the circuit board, wherein the second external component of the anode termination and the second external component of the cathode termination are generally coplanar.

12. The solid electrolytic capacitor of claim 11, wherein the anode includes tantalum, niobium, or an electrically conductive oxide thereof.

13. The solid electrolytic capacitor of claim 11, wherein an anode lead is electrically connected to the anode.

14. The solid electrolytic capacitor of claim 13, wherein the anode termination includes a first internal component and a second internal component.

15. The solid electrolytic capacitor of claim 14, wherein the first internal component is generally parallel to a lower surface of the capacitor element and wherein the second internal component is generally perpendicular to the lower surface of the capacitor element.

16. The solid electrolytic capacitor of claim 15, wherein the second internal component contains a region for receiving the anode lead.

17. The solid electrolytic capacitor of claim 16, wherein the region is U-shaped.

18. The solid electrolytic capacitor of claim 11, wherein the solid electrolyte includes manganese dioxide, a conductive polymer, or a combination thereof.

* * * * *